METHOD AND APPARATUS FOR ASSEMBLING ELECTRICAL COMPONENTS ON PRINTED CIRCUIT BOARDS

Filed Sept. 5, 1967 2 Sheets-Sheet 1

INVENTOR
LINUS O. HUBBARD
By Mason, Kolehmainen, Rathburn & Wyss
Attorneys

INVENTOR
LINUS O. HUBBARD
By Mason, Kolehmainen, Rathburn & Wyss
Attorneys

United States Patent Office 3,548,493
Patented Dec. 22, 1970

3,548,493

METHOD AND APPARATUS FOR ASSEMBLING ELECTRICAL COMPONENTS ON PRINTED CIRCUIT BOARDS

Linus O. Hubbard, Chicago, Ill., assignor to Wells-Gardner Electronics Corporation, Chicago, Ill., a corporation of Illinois Filed Sept. 5, 1967, Ser. No. 665,418
Int. Cl. H05k *3/30*
U.S. Cl. 29—626 6 Claims

ABSTRACT OF THE DISCLOSURE

As a tray of identical components comes before the assembler, one or more tiny lamps illuminate the location or locations on the printed circuit board where components from that tray are to be mounted. The assembler then inserts parts from that tray into the circuit board at the illuminated locations. Preferably a translucent board is used, and illumination comes from behind the board. The shape of the illuminated spot and its orientation on the printed circuit board are adjusted so as to indicate the shape and orientation of the part being mounted.

This invention relates to a method and apparatus for manually assembling electrical components on printed circuit boards, and, more particularly, to a method and apparatus whereby the assembler is instructed as to the placement of a given component. Specifically, this invention calls for illumination of the circuit board at the location where a component is to be inserted, and simultaneous presentation of the proper part to the assembler.

Certain arrangements have been heretofore proposed for facilitating the assembly of electrical components on printed circuit boards. One such arrangement utilizes as an assembly guide, a series of colored lights shining through the component mounting holes, a different color being used for each type of part. Another arrangement uses a color photograph of a fully assembled board as a guide to the assembler, the photographic image being projected upon the blank board. These two arrangements are both objectionable in that they require continuous illumination of the entire board. Since no one location is highlighted so as to stand out from the rest, such arrangements force the assembler to continuously scan the board in search of component mounting positions. The colored light scheme is further deficient in not providing any means whereby the preferred orientation of parts can be indicated.

A third arrangement proposed for facilitating component assembly utilizes sequentially illuminated individual lights to show component placement, but the lights appear on a separate chart or schematic diagram, and not on the board itself. While this third arrangement is an improvement over the above-described arrangements, it forces the assembler to continuously shift her eyes between the light chart and the circuit board, thus wasting time and producing considerable eye and neck strain. Additionally, if components are closely spaced, it is difficult for the assembler to match up a location on the chart with the corresponding location on the board. As a result, the maximum number of components which the average operator can assemble accurately is severely limited.

It is, therefore, a primary object of the present invention to provide a new and improved method of and apparatus for assembling components on a printed circuit board which eliminates one or more of the above-mentioned disadvantages of prior art arrangements.

It is another object of the present invention to provide a new and improved method of and apparatus for assembling components on a printed circuit board whereby a single operator can accurately assemble a large number of components of different types in a relatively short period of time.

It is a further object of the present invention to provide a new and improved method of and apparatus for assembling components on a printed circuit board in which light is directed through localized areas of a translucent board corresponding to the locations of a particular type of part and said localized areas are shifted as different parts are made available to the assembler to correspond to the locations at which said different parts are to be assembled.

Briefly considered, the present invention relates to methods and apparatus for assembling components on a printed circuit board wherein only discrete areas of the board are sequentially illuminated in a manner arranged to correspond with locations where the edifferent parts are to be placed. By means of switches coupled to a com-component dispensing device, the illuminated part of the board is caused to shift as new components come before the assembler. There is never any need for the assembler to look away from the circuit board; she merely picks up parts and places them in the illuminated locations. Accordingly, a considerably larger number of components of different types may be accurately assembled by a single operator. This, in turn, means that the efficiency of the operator is increased. Also, in situations where a limited production schedule is desired, a small number of operators can maintain the desired rate of production continuously, thereby eliminating the more inefficient method of hiring a large number of operators for a short run, ceasing production and then re-hiring and re-training a new large group of operators.

The invention, both as to its organization and method of operation, together with further objects and advantages thereof, will best be understood by reference to the following specification, taken in connection with the accompanying drawings, in which.

Figure 1:
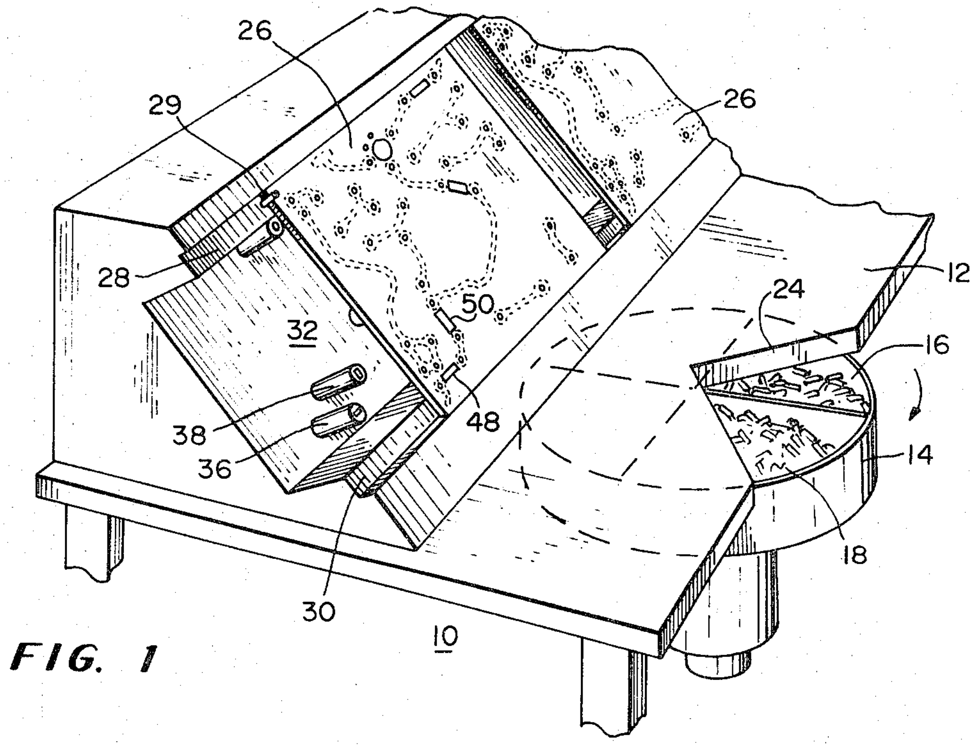
FIG. 1 is a perspective view of a printed circuit board assembly apparatus embodying the principles of the present invention.

Referring now to the drawings, the present invention is therein illustrated as comparing a printed circuit board assembly apparatus, indicated generally at 10, which includes a work surface 12. Immediately below the work surface 12, there is provided a rotatable component supporting tray 14 which is divided into a number of compartments, 16, 18, 20 and 22 each adapted to hold a number of identical components of a particular type which are to be assembled on printed circuit boards. The work surface 12 is provided with a V-shaped opening 24 providing access to one of the compartments 16, 18, etc. of the rotatable tray 14, so that only one particular type of component will be available to the assembler at a particular time. In this connection, it will be understood that while the rotatable tray 14 has been shown, for purposes of simplicity, as having only four compartments, in an actual assembly apparatus the tray 14 may have a much larger number of comartments for different types of components, since each assembler can accurately assemble a large number of different parts on the board in an accurate manner in accordance with the arrangement of the present invention. Also, it will be understood that the opening 24 is shown merely by way of illustration and any other suitable means may be employed to guide the assembler in choosing the proper compartment in the tray 14.

Various types of electronic components may be positioned in the different compartments of the tray 14. For example, disk type capacitors are shown in the compartment 22, resistors are shown in the compartments 16 and 18, and small inductance units, such as coils or IF transformers are shown in the compartment 20. Each of these components is provided with two or more projecting leads which are arranged to be inserted ito appropriate holes in the printed circuit board, as will be readily understood by those skilled in the art.

Immediately in front of the operator, and preferably positioned at an angle to the horizontal to facilitate insertion of components, a track arrangement is provided which is suitable for holding a number of translucent printed circuit boards 26. More particularly, a pair of spaced rails 28 and 30 are provided to support the upper and lower edges of the printed circuit boards 26 so that these boards may be slid along the rails 28, 30 from one assembly position to the next.

In accordance with the present invention, a well, indicated generally at 32, is provided beneath the printed circuit boards 26 and between the rails 28, 30 within which are positioned a number of individual light sources 36, 38. The particular one of the printed circuit boards 26 on which parts are to be assembled is positioned at a pre-established assembly position along the length of the rails 28, 30 so that light from these individual light sources will be directed through the translucent board 26 in small localized areas corresponding to the positions on the board at which a particular component is to be assembled. Any suitable means may be provided for holding the board at the assembly position while parts are being assembled thereon in the manner described in more detail hereinafter. For example, a pin 29 may be provided in the rail 28 against which the board may be held for accurate registration at the assembly position.

Figure 3:
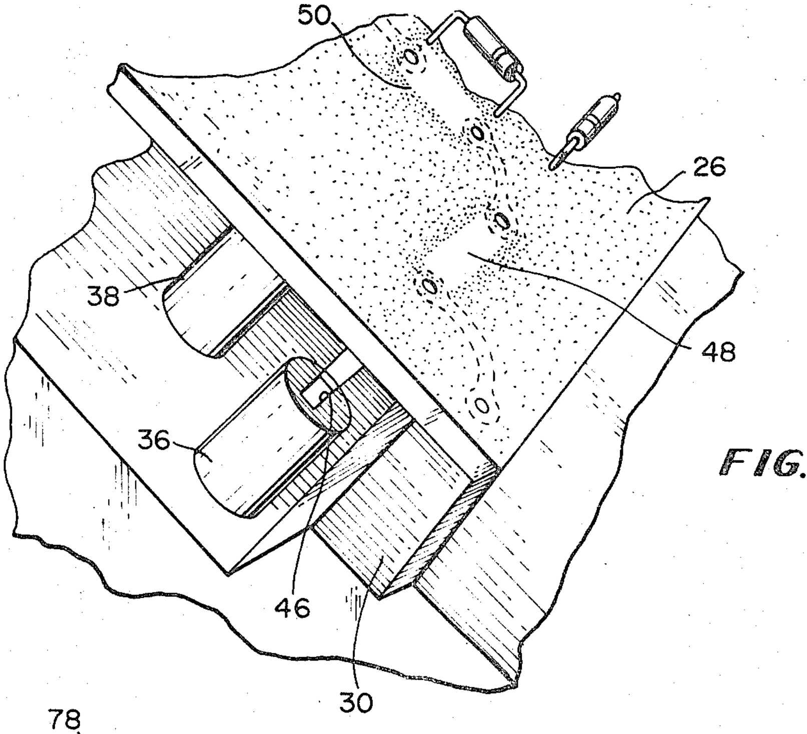
FIG. 3 is a fragmentary perspective view of a portion of the apparatus shown in FIG. 1, taken on an enlarged scale, and illustrating the formation of light spots on the printed circuit board in accordance with the invention.
Figure 4:
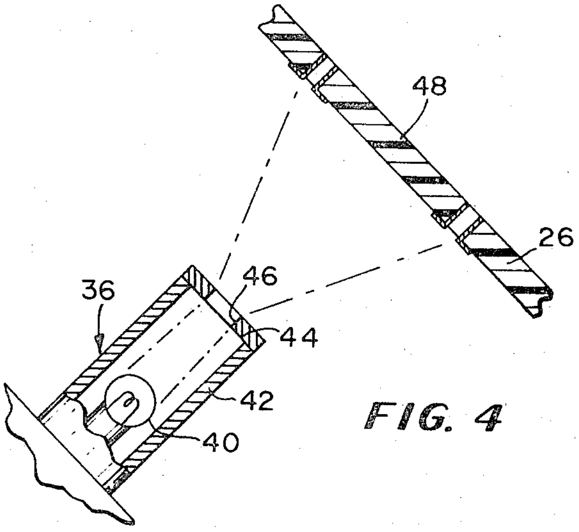
FIG. 4 is a left side view, partly in section, of the apparatus shown in FIG. 3.

The light source 36, for example, may comprise a small incandescent bulb, 40, in FIG. 4, which is mounted in a suitable receptacle at the bottom of a hollow cylindrical tube 42 of opaque material. An end disk 44, also of opaque material, is secured to the outer end of the tube 42, and is provided with a cutout 46 having a shape similar to the component to be mounted. Accordingly, light from the bulb 40 is directed through the translucent board so that an illuminated area, 48, in FIGS. 3 and 4, is visible to the assembler, who views the board from the front, and the assembler is thereby informed of the specific location of the component on the board 26. In a similar manner, as is shown in FIG. 3, light from the source 38 is directed through the board 26 in the area 50. It will be noted that the illuminated areas 48 and 50 in FIG. 3, since they correspond roughly to the silhouettes of the respective parts, not only inform the assembler of the specific location of the component part on the printed circuit board, but also inform the assembler of the particular orientation of the major axis of the part with respect to the board. Thus, the illuminated area 48 tells the assembler that a component is to be mounted parallel to the rails 28 and 30, whereas the area 50 indicates that the component is to be mounted perpendicularly to the rails 28 and 30. Such orientation facilitates insertion of the component leads into the appropriate holes in the printed circuit board which may be located at either end of the lighted area.

Figure 2:
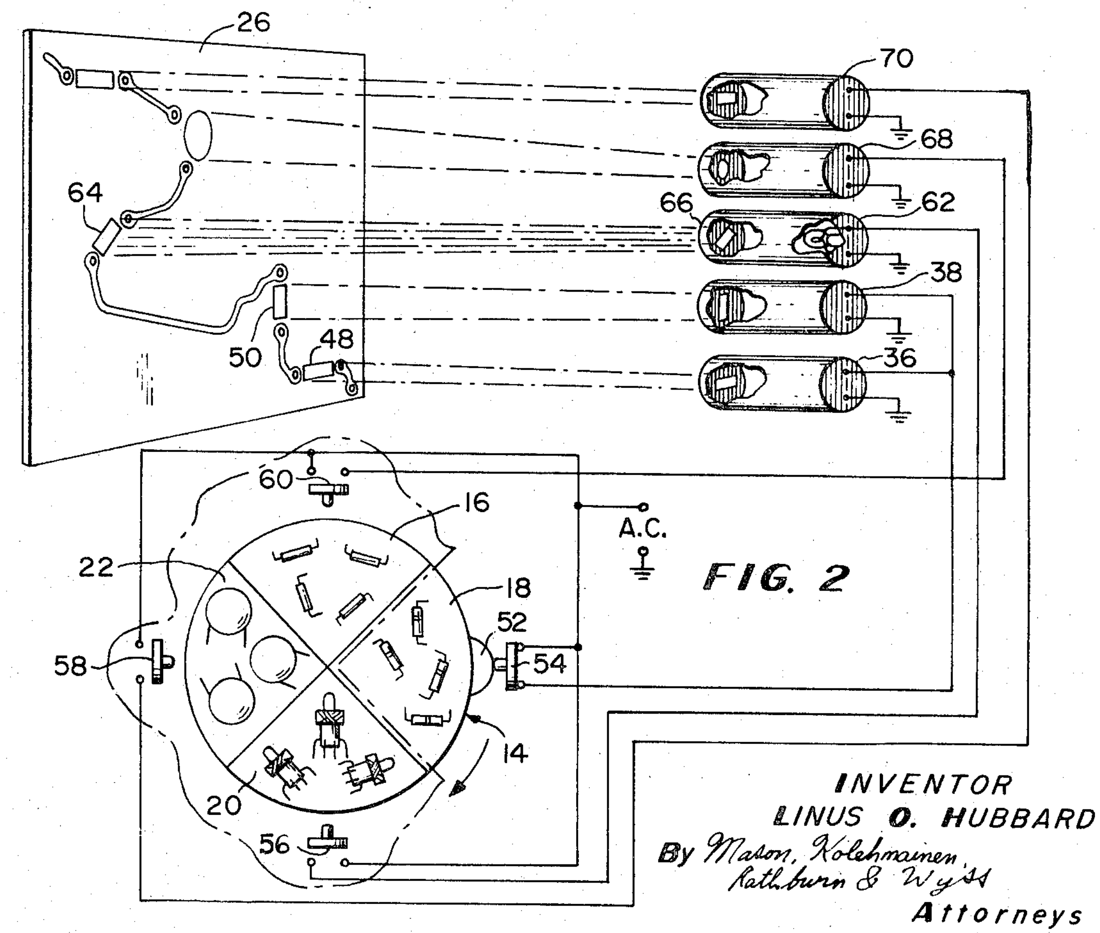
FIG. 2 is a schematic diagram, partly diagrammatic, of the apparatus of FIG. 1.

One of the above-described light sources is provided for each component which is to be mounted on the printed circuit board at a particular assembly station and each light source is accurately positioned with respect to the assembly position of the boards so that light from each source will be directed through the board in the desired area when a given board is moved to the assembly position. Also, a switching arrangement is provided so that when a particular compartment of the tray 14 is accessible to the assembler only those light sources are energized which correspond to areas of the board on which components within said particular compartment are to be mounted. More particularly, a suitable cam element, indicated diagrammatically at 52 in FIG. 2, is provided in association with the tray 14 so that the cam element 52 rotates in synchronism with this tray. A series of microswitches 54, 56, 58 and 60 are arranged to be engaged sequentially by the cam element 52, these switches being positioned so that when a particular compartment of the tray 14 is accessible to the assembler, the corresponding one, or ones, of the light sources are energized. For example, when the switch 54 is closed by the cam element 52, the resistors in the compartment 18 are accessible to the assembler and the light sources 36 and 38 are energized in parallel from a suitable alternating current source. These sources direct light through the translucent board 26 in the areas 48 and 50 and the assembler is thereby informed that a resistor from the compartment 18 is to be mounted on the board in each of these areas. When these components have been mounted on the board the light from the sources 36 and 38 is at least partially blocked by the components which have been mounted in the areas 48, 50. Since only the light sources 36 and 38 are thus energized, the assembler, who views the board from the front, is informed by the absence of any bright spots of light on the board that all components of that particular value have been mounted on the board. The assembler then manually rotates the tray 14 to bring the next compartment into registration with the opening 24. In this connection it will be understood that a suitable detect mechanism (not shown) may be provided for the tray 14, to position it in proper registration with the opening 24 and the switches 54, 56, 58 and 60 so that the assembler can merely rotate the tray 14 until the next detect position is reached.

When the next compartment 16 is moved into registration the microswitch 56 is closed and only the light source 62 is energized, it being assumed that only one component from the compartment 16 is to be mounted on the board. When this occurs, a spot of light 64 is projected onto the back of the board 26 and is transmitted through this board, the spot 64 having the general shape of the components in the compartment 16, due to the configuration of the cutout 66 in the end of the light source 62. Also, it will be noted that the spot of light 64 is oriented at the proper angle relative to the board 26 to assist the assembler in placing the component in the correct holes in the board.

At succeeding positions of the tray 14 the light sources 68 and 70 are sequentially energized and the corresponding components in the respective trays are mounted on the printed circuit board. The board is then moved along the rails 28, 30 to the next assemly position and a new board is positioned in accurate registration with respect to the light sources 36, 38, 62, 68 and 70. In this connection, it is pointed out that when a large number of light sources are required, as in the practical case of a radio or television chassis which may have several hundred parts, the use of individual tubes and cutouts for each source may be eliminated and a sheet of opaque material substituted in which all of the cutouts are made for all components to be mounted at a particular station. A light bulb is positioned behind each cutout, and, if the cutouts are widely separated, these bulbs need not be shielded laterally. It will also be understood that any other suitable optical arrangement may be provided for projecting light spots of the proper shape, orientation and intensity through the translucent circuit board under the control of the above-described switching arrangement. Furthermore, in situations where the printed circuit board is opaque, the light sources may be directed upon the side of the printed circuit board on which the components are mounted so that the areas in which different parts are to be mounted are sequentially illuminated. However, in such situations the light sources must be positioned far enough above the board, or to the side, so that they do not interfere with the insertion of components onto the board.

Certain components, such as resistors, may be inserted into the board with either one of two polarities but the polarity of insertion makes no difference in the operation of the electronic circuit. On the other hand, other components, such as diodes, polarized transformers, and the like, are capable of insertion in either of two different polarities but the component must be inserted with the correct polarity in order that the circuit function properly. In accordance with a further feature of the invention, the spot of light transmitted through the board may have a configuration such that the assembler is informed of the correct polarity of insertion for a given component. By comparing the component with the polarized indication on the board, the assembler can then insert the component into its proper mounting holes with the correct polarity.

Figure 5:
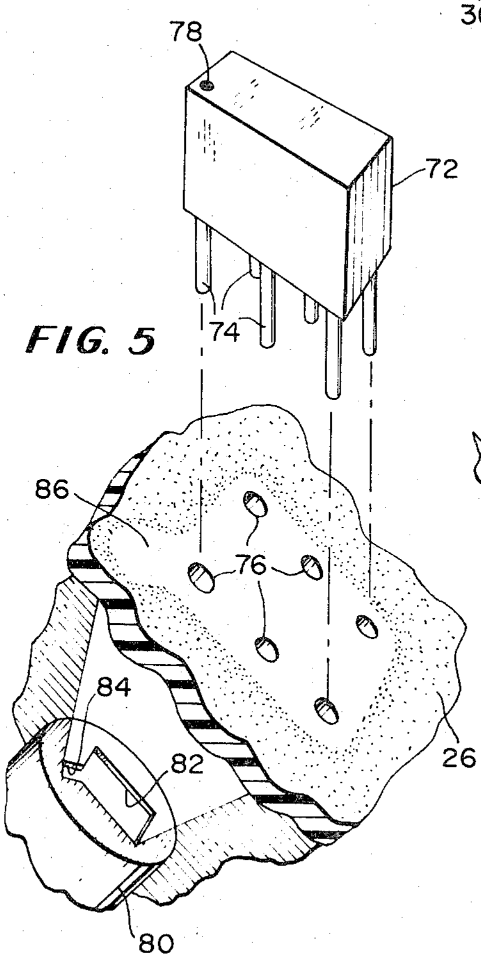
FIG. 5 is a perspective view of an alternative arrangement in accordance with the present invention wherein the projected light spot indicates the proper orientation of a part which may be mounted in one of several different orientations on the board.

For example, in FIG. 5 there is shown a small transformer unit 72 which is to be mounted on the board 26, the transformer 72 having a series of six terminals 74 which are arranged to be inserted into the holes 76 in the printed circuit board 26. Since the terminals 74 are symmetrically arranged the transformer 72 can be mounted on the board in either of two orientations. However, only one orientation is correct, as shown by a small dot 78 on the top of the transformer case 72. In order to indicate this fact to the assembler, the cutout 82 in the light source 80 is provided with a polarity indicating notch 84 in the upper left-hand corner of the cutout 82 and the notch 84 causes a corresponding spike of light 86 to be projected through the board 26. The assembler then simply positions the transformer 72 so that the polarity dot 78 is oriented in the same direction as the light spike 86 and then mounts the transformer 72 in the holes 76 in the printed circuit board 26. In this connection it will be understood that any other suitable modification of the normal light pattern transmitted through the board may be provided for polarity indication. For example, the outline of the light spike may correspond to the component itself and a portion of this light pattern may be intensified to indicate the correct polarity of the component to the assembler.

It will be noted from the foregoing description that the component mounting arrangement of the present invention is effective to reduce the number of errors over arrangements in which the component locations are provided on a separate chart or diagram, since the assembler is not required to transfer information from such external chart to the board itself. Furthermore, components can be assembled at a relatively rapid rate on the board. Also, by means of the arrangement of the present invention, operator fatigue is reduced since there is less motion of the neck, and furthermore, operator eyestrain is also reduced since the operator is not required to continually change the focal range of the eye as would be the case in using an external chart. In addition, it has been found that the training time for assemblers using the arrangement of the present invention is less, and less instructions are required and the arrangement requires less intelligence and alertness on the part of the assembler. Furthermore, fewer inspectors, fewer repairers and fewer testers are required, and the improved quality of the assembling operation simplifies all later assembly line operations.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. The method of assembling parts on a translucent printed circuit board which comprises the steps of placing the various parts which are to be mounted into separate compartments, positioning a printed circuit board adjacent to said compartments, sequentially shining light from a plurality of light sources through said translucent circuit board in areas which define generally by their shape and location on said board where the parts from any one of said compartments are to be placed, and sequentially mounting the parts from said compartments onto said printed circuit board in the translucently illuminated areas thereof.

2. The method of assembling parts on a printed circuit board set forth in claim 1 in which said illuminated areas are further arranged to show the preferred orientation of one or more parts.

3. Electronic component assembly apparatus comprising a series of compartments each adapted to hold a plurality of similar parts, means for supporting a translucent printed circuit board at an assembly station at which parts from said compartments are to be assembled, a plurality of light sources positioned on one side of said assembly station, masking means for directing light from said sources to localized areas in the plane of said assembly station which correspond in shape and location to the positions of parts which are to be assembled, whereby light is diffusedly transmitted through a board positioned at said assembly station in said localized areas to indicate to an observer located on the other side of said assembly station where parts contained in said compartments are to be mounted, and switch means for sequentially energizing said light sources so that the locations on a board positioned at said assembly station where parts from any one of said compartments are to be mounted may be successively illuminated so that the parts in said compartments may be quickly and accurately mounted on said board.

4. The apparatus of claim 3, wherein said plurality of compartments are arranged on a movable conveyor and said conveyor is arranged to bring different ones of said compartments to a loading position in the vicinity of said assembly station in coordination with the sequential energization of said light sources by said switch means.

5. The apparatus of claim 4, wherein only one of said compartments of said conveyor is accessible at said loading station, and said switch means is controlled in coordination with the movement of said conveyor so that only those light sources are energized which correspond to the location of parts contained in the particular compartment which is accessible at said loading station.

6. The apparatus of claim 3, wherein said series of compartments are arranged to move in a given path, means positioned adjacent said path for permitting access to only one of said compartments at a loading position as said compartments are moved along said path, and means for automatically controlling said switch means in accordance with movement of different ones of said compartments to said loading position.

References Cited

UNITED STATES PATENTS

| | | | |
|---|---|---|---|
| 3,112,354 | 11/1963 | Urias et al. | 29—407X |
| 3,171,204 | 3/1965 | Balducci. | |
| 3,250,992 | 5/1966 | Cronkite et al. | |
| 3,336,650 | 8/1967 | Bosler et al. | 29—407X |
| 3,372,455 | 3/1968 | Howie | 29—407 |
| 3,407,480 | 10/1968 | Hill et al. | 29—407X |
| 1,760,538 | 5/1930 | Becker | 29—203 |
| 2,906,016 | 9/1959 | Cannon, Jr. et al. | 29—625X |
| 3,052,842 | 9/1962 | Frohman et al. | 29—407 |
| 3,169,305 | 2/1965 | Gray | 29—407X |
| 3,194,279 | 7/1965 | Brown | 29—407X |
| 3,290,767 | 12/1966 | Mamie | 29—200 |
| 3,440,531 | 4/1969 | Jasorku et al. | 29—624 |

JOHN F. CAMPBELL, Primary Examiner

R. W. CHURCH, Assistant Examiner

U.S. Cl. X.R.

29—407, 203